United States Patent
Laufer et al.

(10) Patent No.: US 9,456,517 B2
(45) Date of Patent: Sep. 27, 2016

(54) DATA TRANSFER DEVICE WITH CONFIGURABLE SLOT SIZES AND METHODS OF USING THE SAME

(71) Applicant: MRV Communications Americas, Inc., Chelmsford, MA (US)

(72) Inventors: Eli Laufer, Woodland Hills, CA (US); Mark Baumann, Simi Valley, CA (US); Sergiu Rotenstein, Oak Park, CA (US)

(73) Assignee: MRV COMMUNICATIONS AMERICAS, INC., Chelmsford, MA (US)

( * ) Notice: Subject to any disclaimer, the term of this patent is extended or adjusted under 35 U.S.C. 154(b) by 97 days.

(21) Appl. No.: 14/054,740

(22) Filed: Oct. 15, 2013

(65) Prior Publication Data

US 2014/0268599 A1 Sep. 18, 2014

Related U.S. Application Data

(60) Provisional application No. 61/793,901, filed on Mar. 15, 2013.

(51) Int. Cl.
*H05K 7/14* (2006.01)
*H05K 7/20* (2006.01)
*H04Q 1/02* (2006.01)

(52) U.S. Cl.
CPC ............ *H05K 7/1461* (2013.01); *H04Q 1/025* (2013.01); *H05K 7/1417* (2013.01); *H05K 7/1418* (2013.01); *H05K 7/1452* (2013.01); *H05K 7/1457* (2013.01); *H05K 7/20572* (2013.01); *Y10T 29/49117* (2015.01)

(58) Field of Classification Search
CPC .... H01R 12/50; H01R 23/68; H05K 7/1418; H05K 7/1417
See application file for complete search history.

(56) References Cited

U.S. PATENT DOCUMENTS

| | | | | |
|---|---|---|---|---|
| 3,644,868 A * | 2/1972 | Nevala | ............... | H01R 12/7005 174/138 F |
| 4,002,381 A * | 1/1977 | Wagner | ................ | H05K 7/1409 211/41.17 |
| 4,068,290 A * | 1/1978 | Wetherbee | .......... | H05K 7/1418 361/756 |
| 5,167,511 A * | 12/1992 | Krajewski | ................ | H01R 4/01 361/785 |
| 5,467,254 A * | 11/1995 | Brusati | ................ | H05K 7/1409 174/355 |
| 6,008,995 A * | 12/1999 | Pusateri | .................. | G06F 1/184 361/752 |
| 6,191,953 B1 * | 2/2001 | Aggus | .................. | H05K 7/1418 174/560 |

(Continued)

OTHER PUBLICATIONS

Notification of Transmittal of the International Search Report and the Written Opinion of the International Searching Authority, or the Declaration mailed on Jul. 30, 2014 for International Application No. PCT/US2014/030644, International filing date: Mar. 17, 2014.

(Continued)

*Primary Examiner* — Zachary M Pape
*Assistant Examiner* — Douglas Burtner
(74) *Attorney, Agent, or Firm* — Hackler Daghighian Martino & Novak

(57) ABSTRACT

A data transfer device that comprises: a chassis; a backplane; a slot arranged within the chassis and configured to hold a card; and a connector system integrated on the backplane and configured to electrically couple the card with the backplane; wherein the connector system includes a group of connectors arranged along a length of the slot such that a plurality of cards with card lengths less than the length of the slot may be electrically coupled to the backplane within a single slot.

14 Claims, 12 Drawing Sheets

(56) References Cited

U.S. PATENT DOCUMENTS

| | | | | |
|---|---|---|---|---|
| 6,377,470 B1* | 4/2002 | Hayward | H05K 7/1418 | 165/80.3 |
| 6,450,597 B1* | 9/2002 | Bell | G06F 1/181 | 211/41.12 |
| 6,646,890 B1* | 11/2003 | Byers | H05K 7/1418 | 211/41.17 |
| 6,948,968 B1* | 9/2005 | Shearman | H05K 7/1418 | 361/802 |
| 7,167,380 B2* | 1/2007 | Ice | H05K 7/1418 | 361/727 |
| 7,177,157 B2* | 2/2007 | Aronson | H01R 12/7023 | 361/727 |
| 7,414,852 B1* | 8/2008 | Otte | H05K 7/1424 | 312/223.1 |
| 7,843,704 B2* | 11/2010 | Chang | H05K 7/1461 | 361/741 |
| 8,054,619 B1* | 11/2011 | Antosh | G06F 1/185 | 361/679.31 |
| 8,184,442 B2* | 5/2012 | Fujimura | H05K 7/1418 | 361/756 |
| 2002/0006026 A1* | 1/2002 | Takahashi | H05K 7/1418 | 361/679.46 |
| 2004/0212973 A1* | 10/2004 | Ice | H05K 7/1418 | 361/796 |
| 2005/0060463 A1* | 3/2005 | Le | H04L 41/046 | 710/300 |
| 2008/0055877 A1* | 3/2008 | Berke | H05K 7/1487 | 361/801 |
| 2012/0063084 A1* | 3/2012 | Fowler | H05K 7/1418 | 361/690 |

OTHER PUBLICATIONS

Notification of Transmittal of International Preliminary Report on Patentability, International Preliminary Examining Authority, PCT/US14/30644, Mar. 25, 2015.

* cited by examiner

DATA TRANSFER DEVICE WITH CONFIGURABLE SLOT SIZES AND METHODS OF USING THE SAME

CROSS-REFERENCE TO RELATED APPLICATION

This application claims the benefit of U.S. Provisional Application No. 61/793,901 filed Mar. 15, 2013.

FIELD

The present patent document relates to data transfer devices with configurable slot sizes and methods of using the same. More particularly, the present patent document relates to chassis and backplanes that allow the installation and use of line cards with various different form factors, and power and data requirements.

BACKGROUND

Rather than making entire electronic systems that are designed to perform a particular function, manufactures of networking equipment and other electronic systems have realized that they may manufacture a modular chassis that holds replaceable cards with varying functionalities. Accordingly, each customer can purchase and fill their modular chassis with cards that have the required functionality to meet their particular desires. Modular chassis and their associated cards allow customers flexibility, the ability to easily expand capability, the ability to easily switch functionality, and a number of other benefits.

The theory behind the modular chassis is that most cards have the same overall requirements with respect to power and other essentials provided by the chassis. Therefore, numerous cards may be designed in the same form factor and with the same chassis interface. Cards that are designed in such a manner are interchangeable within a chassis.

The problem is, that in reality, many cards have different needs in terms of size and power requirements. The diverse requirements of different line cards makes it practically impossible to design a system with a card form factor optimized for all cards, card sizes and card power requirements. Accordingly, cards are made in different form factors and multiple chassis are needed. One solution is to have one system optimized for small cards with low power consumption and another system optimized for large cards with high power consumption. This solution has many disadvantages. For example, customers often need a mixture of small and large cards, which requires them to buy both a small and large chassis. Moreover, customers' systems often grow as they mature and this growth may require a different mixture of cards not supported by the current chassis. Having to upgrade an entire chassis to support a new card form factor is extremely expensive for the customer.

Another solution is to have a card adapter for small cards that allows the card with the smaller form factor to plug into a slot designed for a large card. One problem with this solution is that it wastes considerable chassis space because a small form factor card takes up an entire large form factor slot.

SUMMARY OF THE EMBODIMENTS

In view of the foregoing, an object according to one aspect of the present patent document is to provide a data transfer device with configurable slot sizes. Another aspect of the present document is to provide a method of configuring a chassis to accommodate a plurality of cards with different form factors. Preferably the methods and apparatuses address, or at least ameliorate one or more of the problems described above. To this end, a data transfer device is provided. In one embodiment, the data transfer device comprises: a chassis, a backplane, a slot arranged within the chassis and configured to hold a card; and a connector system integrated on the backplane and configured to electrically couple the card with the backplane; wherein the connector system includes a group of connectors arranged along a length of the slot such that a plurality of cards with card lengths less than the length of the slot may be electrically coupled to the backplane within a single slot. In a preferred embodiment, the data transfer device is designed to hold optical data networking cards.

In some embodiments, the pin configuration of each connector in the group of connectors includes both power pins and data pins. In some of those embodiments, the pin configuration of each connector in the group of connectors is identical. In yet other embodiments of the data transfer device, connectors within a group have pins in the same relative position connected to the same buses on the back plane.

In yet other embodiments, the chassis includes a plurality of slots and a majority of the slots have the identical group of connectors arranged along a length of each slot. In some embodiments the connectors are spaced approximately equally along the length of the slot. In a preferred embodiment the connectors are CompactPCI connectors. However, in other embodiments, the connectors may be any type of connector.

In a preferred embodiment, the data transfer device further comprises a divider configured to removeably attach to the backplane along the length of the slot and assist in holding a plurality of cards with card lengths less than the length of the slot. In certain embodiments that include a divider, the divider is designed to removeably couple to the backplane with a threaded fastener. Also in some embodiments that include a divider, the divider is further configured to removeably attach to the chassis or another divider in an adjacent slot.

In other aspects of the embodiments disclosed in the present patent document, a method of configuring a data transfer device with a plurality of cards is provided. The method comprises: installing a first card of a first length into a first slot; installing a removeable divider along a length of a second slot by screwing the divider into a backplane; and installing a second card of a second length, substantially different from the first length of the first card, in the second slot.

In some embodiments, the method further comprises the step of coupling the second card to the divider with a thumb screw. In yet other embodiments, the method further comprises the step of installing a third card of a third length, substantially different from the first length of the first card, in the second slot. In still yet other embodiments, the method further comprises the step of installing a fourth card of a fourth length, substantially different from the first length of the first card, in the second slot.

In some embodiments, the second card and the third card are the same length. In other embodiments the second card and third card are different lengths. In yet other embodiments, the first card, second card and third card are all different lengths.

In a one configuration of the method, the first card is electrically coupled to a backplane by a first connector in a first group of connectors arranged along a length of the first slot and the second card is electrically coupled to the backplane by a second connector in a second group of connectors arranged along a length of the second slot and wherein the first connector and the second connector are located in different locations along the length of their respective slots.

In another aspect of the embodiments of the present patent document, a chassis for a data receiving device is provided. The data receiving device comprises: a backplane with a plurality of electrical connectors wherein the electrical connectors are patterned in a first direction across a surface of the backplane to form a group and the group is patterned in a second direction perpendicular to the first direction; and wherein a mounting interface for a divider is located between electrical connectors within a group; and a plurality of slots designed to receive cards wherein the slots span across a group of connectors.

In some embodiments, the chassis may further comprise a plurality of dividers removeably attached to a plurality of mounting interfaces wherein the dividers are designed to divide their respective slots into a plurality of slots. In embodiments designed to hold three cards per slot, the backplane may include two mounting interfaces per group.

As described more fully below, the apparatus and methods of the embodiments of a data transfer device with configurable slot sizes is provided. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

The embodiments of data transfer devices disclosed in the present patent document are related to devices that support electronic cards or modules of various different form factors within the same chassis. More particularly, the embodiments disclosed herein relate to chassis with slots that may be configured to accommodate electronic cards of different form factors.

The embodiments of configurable chassis disclosed herein at least ameliorate some of the problems with prior designs by providing a flexible on site adjustable slot size, which allows a user to adjust the slot size to his needs. Accordingly, there is no need to acquire two chassis of different sizes to support cards of different sizes (small and large). The embodiments disclosed herein do not require any kind of external physical adaptor to adapt a card with a small form factor to a larger slot size, such that the small card consumes the entire large slot. Instead, the present patent document teaches systems, devices, and methods that adapt the chassis slot size to the card size using simple on site removeable dividers. Large cards that span the entire slot go into the system natively without any divider while smaller cards use a divider removeably mounted into the chassis. These dividers may be mounted or removed as needed onsite. Accordingly, a single chassis can accommodate cards of various form factors while still maximizing the card density within the chassis.

As used herein the term "card" is used to refer to any modular electronic component designed to function within a chassis. Those skilled in the art understand that the term "cards", with respect to electronic systems, represents any pluggable module. Examples of cards include but are not limited to MRV's®: EM316SW-XY 10/100 Ethernet Card, EM316-2×FP-ET Dual XFP Card, and EM316-4SW-R 4-Port Ethernet Switch Card. Electronic systems in lots of different fields and designed for lots of different purposes may include a modular chassis/card format. Cards are also sometimes referred to as "line-cards", "blades" or "modules" and the general term "card" is meant to encompass devices that go by all such names.

Figure 1:
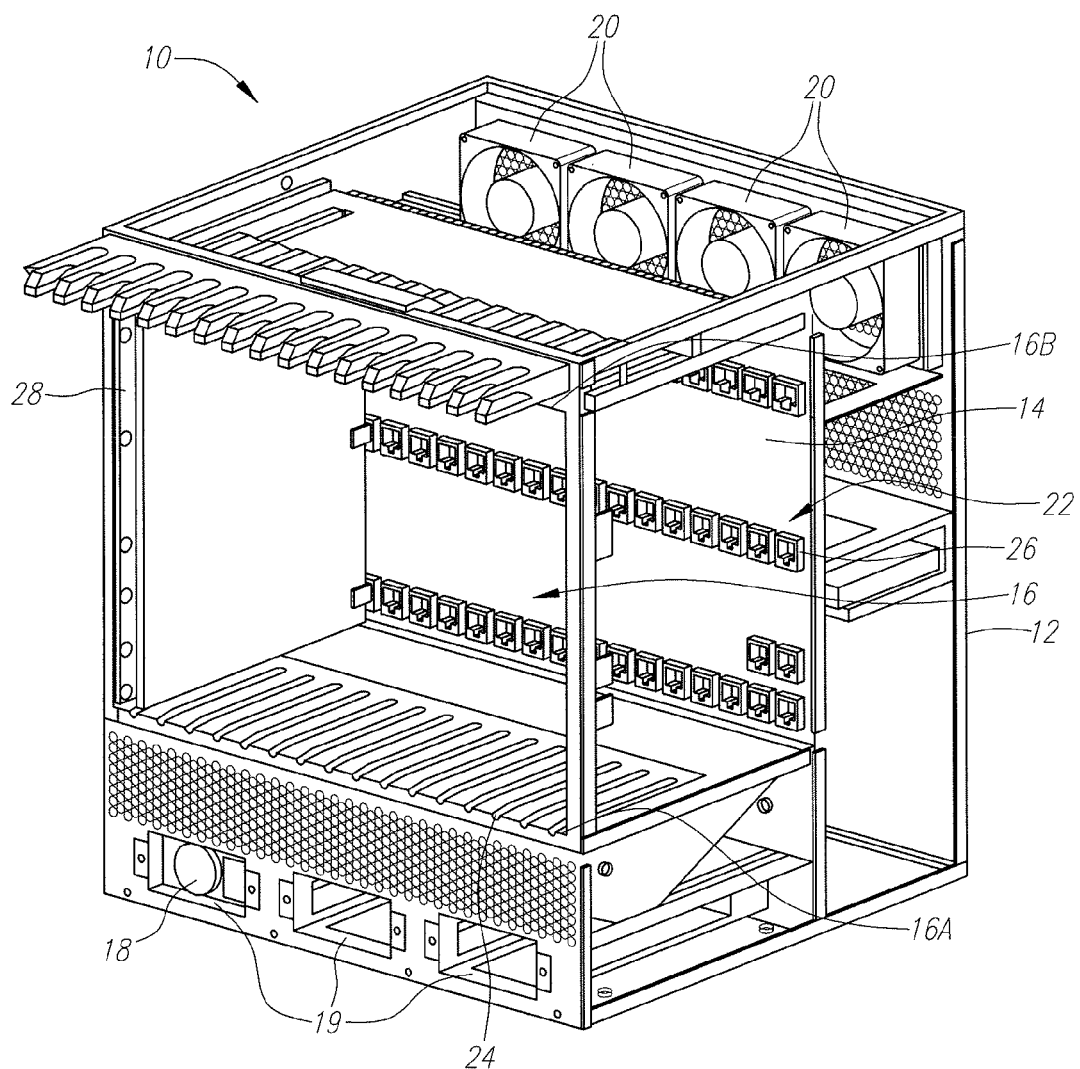
FIG. 1 illustrates a perspective view of an embodiment of a device for data transfer with configurable slot sizes.

FIG. 1 illustrates a data transfer device 10. Data transfer device 10 includes a chassis 12, a backplane 14 and at least one slot 16. The slot 16 in the embodiment shown in FIG. 1 has a length that extends from 16A to 16B and is designed to hold a card 28 of a similar length in the chassis 12. The embodiment shown in FIG. 1 includes a chassis 12 that supports sixteen (16) slots 16 extending horizontally from the left side of the chassis 12 to the right side of the chassis 12. There is no requirement regarding the number of slots 16 a chassis 12 may support. In different embodiments, the chassis 12 may include more or less than sixteen (16) slots 16. For example, the chassis 12 may support as few as a single slot 16 or it could support tens of slots 16.

In addition, the embodiment of the data transfer device 10 shown in FIG. 1 illustrates slots 16 that are patterned across the chassis 12 from left to right and have a length that extends vertically—vertical slots. In other embodiments, the orientation may be different. For example, the slots 16 may extend horizontally across the chassis 12 and be patterned vertically—horizontal slots. Other orientations may also be possible, including combinations of both vertical slots and horizontal slots in the same chassis 12.

The chassis 12 may be made from any type of material such as plastic, rubber, metal or a combination of such materials. In a preferred embodiment, the chassis 12 is made from aluminum, stainless steel or some combination of both metals.

The chassis 12 may further include a number of removeable power supplies 18. The embodiment shown in FIG. 1 illustrates three power supply bays 19 with a single power supply 18 inserted into the leftmost power supply bay 19. In other embodiments, a different number of power supplies 18 may be supported by the chassis 12. In yet another embodiment, the power supplies 18 may be affixed to the chassis 12 such that they are not removeable or not designed to be removeable.

The chassis 12 may also include a number of fans 20. The fans 20 are designed to circulate air throughout the chassis 12 and prevent the cards from overheating. The chassis 12 illustrated in FIG. 1 includes four (4) fans 20. However, in other embodiments, the chassis 12 may have a greater number or fewer number of fans 20. In a preferred embodiment, the chassis 12 includes fan trays in addition to the fans on the rear of the chassis 12. The fan trays slide horizontally into the chassis 12 and circulate air in the vertical direction. In the preferred embodiment, the fan trays are removeable.

In the embodiment shown in FIG. 1, the slots 16 extend vertically from 16A to 16B. The slots 16 may include guides 24 located at the bottom 16A and the top 16B of the slots 16 to hold the cards 28 in place by securing an edge of the card 28. The guides 24 in each slot 16 hold the card in the right location so that when a card 28 is inserted in a slot 16, the electrical connector 21 on the card 18 mates with the correct electrical connector 26 on the backplane 14. The card 28 may also have fasteners that may be used to further secure the card to the chassis 12, brackets attached to the chassis 12, or some portion of an already installed card. In a preferred embodiment, thumb screws are used as the fasteners to secure the cards 28 to the chassis 12, however, in other embodiments, other types of fasteners may be used.

As may be seen in FIG. 1, the data transfer device 10 further comprises a connector system 22. The connector system 22 includes a plurality of connectors 26 and is integrated on the backplane 14. The connector system 22 is configured to electrically couple the cards 28 to the backplane 14 when the cards 28 are inserted into the slots 16 of the chassis 12. The connector system 22 is preferably sized to correspond to the number of slots 16 the chassis 12 is designed to support.

Figure 2:
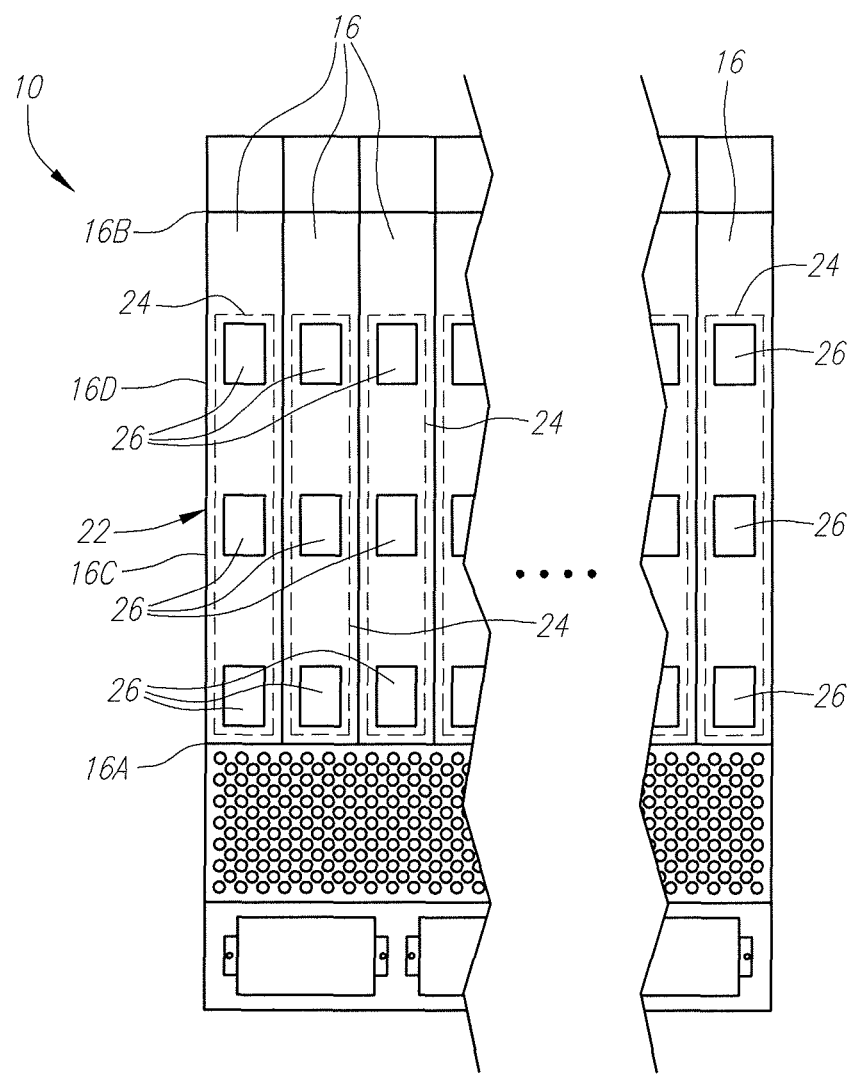
FIG. 2 illustrates a broken view of an embodiment of a device for data transfer with configurable slot sizes.

FIG. 2 illustrates a broken view of an embodiment of a device for data transfer with configurable slot sizes 10. In a preferred embodiment, such as the one shown in FIG. 2, each slot 16 has a corresponding group of connectors 24 in the connector system 22. In the embodiments shown in FIG. 2, each slot 16 has a group of connectors 24 that includes three connectors 26. In other embodiments, the group of connectors 24 may include a larger number or smaller number of connectors 26. By providing a group of connectors 24 arranged along the length of the slot 16, a plurality of cards with a form factor smaller than the length of the slot 16 may all be inserted and electrically coupled to the backplane 14 within the same slot 16. In a preferred embodiment, the connectors 26 within a group of connectors 24 are spaced an equal distance apart within the slot 16. Spacing the connectors 26 in a group of connectors 24 an equal distance apart within the length of the slot 16 establishes the minimal height for the smallest form factor card that may be supported.

In the embodiment shown in FIG. 2, a "full size" or "3 unit" card would span from the bottom 16A of the slot 16 to the top 16B of the slot 16. A 3 unit card would span 3 connectors 26 and the associated space corresponding to each connector 26 i.e., the space above and below each connector assuming the slot 16 is divided into 3 equal portions. When a card that is "full size" or "3 units" is inserted, the card may be electrically coupled to the backplane through all the connectors 26 in the group of connects 24 or a subset of the connectors 26 in the group of connectors 24. For example, in one embodiment, the card may comprise a plurality of connectors that are designed to mate with all three connectors 26 in the group of connects 24 or a subset of all three connectors in the group of connectors 24. In a preferred embodiment, a "full size" card plugs into a single connector 26. However, if a card design requires more power, more control bandwidth, or more bandwidth for any type of communication, the card may plug into more than one connector 26 in the group of connects 24.

One advantage to having a group of connectors 24 arranged to correspond to a single slot 16 is that a single slot 16 may be designed to support more than one card of a smaller form factor than a "full size" card. For example, a "2 unit" card i.e., a card that physically spans two-thirds of a slot 16 may be inserted. In a preferred embodiment of a 2 unit card, the 2 unit card spans 2 connectors 26. In different embodiments, the 2 unit card may use 2 connectors to electrically couple it to the backplane or it may use a single connector. A card that needs more bandwidth to the backplane or power might take advantage of the extra connector while a card that does not need extra power or bandwidth may use a single connector even though it spans two. In one configuration, a 2 unit card may span the gap in a slot 16 from the top 16B to a position approximately two-thirds of the way up down or 16C. In another configuration, a 2 unit card may span the gap in a slot 16 from the bottom 16A to a position approximately two-thirds of the way up or 16D. In a preferred embodiment of the data transfer device 10, both configurations are supported.

Although numerous ways to electrically couple cards to the backplane 14 exist, in a preferred embodiment, there is a scheme for electrically coupling cards to the backplane 14 that is based on the height of the cards. For example, in one such embodiment employing a scheme, a 3 unit card always plugs into the bottom connector 26 in a group of connectors 24; a 2 unit card always plugs into a the middle connector 26 in the group of connectors 24; and a single unit card preferably plugs into the top connector 26 although it may plug into any of the three connectors. In other embodiments, other schemes are possible. In other embodiments, cards may be coupled to the backplane without a scheme and may use any connector or combination of connectors.

The connectors 26 may be any kind of connector. In a preferred embodiment the connector 26 complies with a standardized connector, such as Compact Peripheral Component Interconnect (PCI) connector, which is standardized by the PICMG organization. However, in other embodiments, a custom connector may be used. In a preferred embodiment, the connector 26 compliments the bus interconnect used by the backplane 14. In the embodiment shown in FIG. 1 and FIG. 2, a 55 pin CompactPCI connector is used.

The backplane 14 may be any card designed to allow other removable cards to be interfaced into a system. Typically, the minimum function of a backplane 14 is to allow cards in different slots 16 to share at least one bus. A backplane 14 does not necessarily need to be located in the back of the device and one skilled in the art will recognize it may be located in other locations such as the middle of the device. A card located in the middle of the device may be referred to as a midplane. However, the term "backplane" as used herein includes midplanes and cards with other names but providing the same functionality as a backplane 14.

In different embodiments, the backplane 14 may be passive or active. In embodiments with an active backplane 14, the backplane 14 may be actively involved in switching data from card to card. In other embodiments, the backplane 14 may simply provide management/monitoring services and/or environmental control to the cards.

Figure 2A:
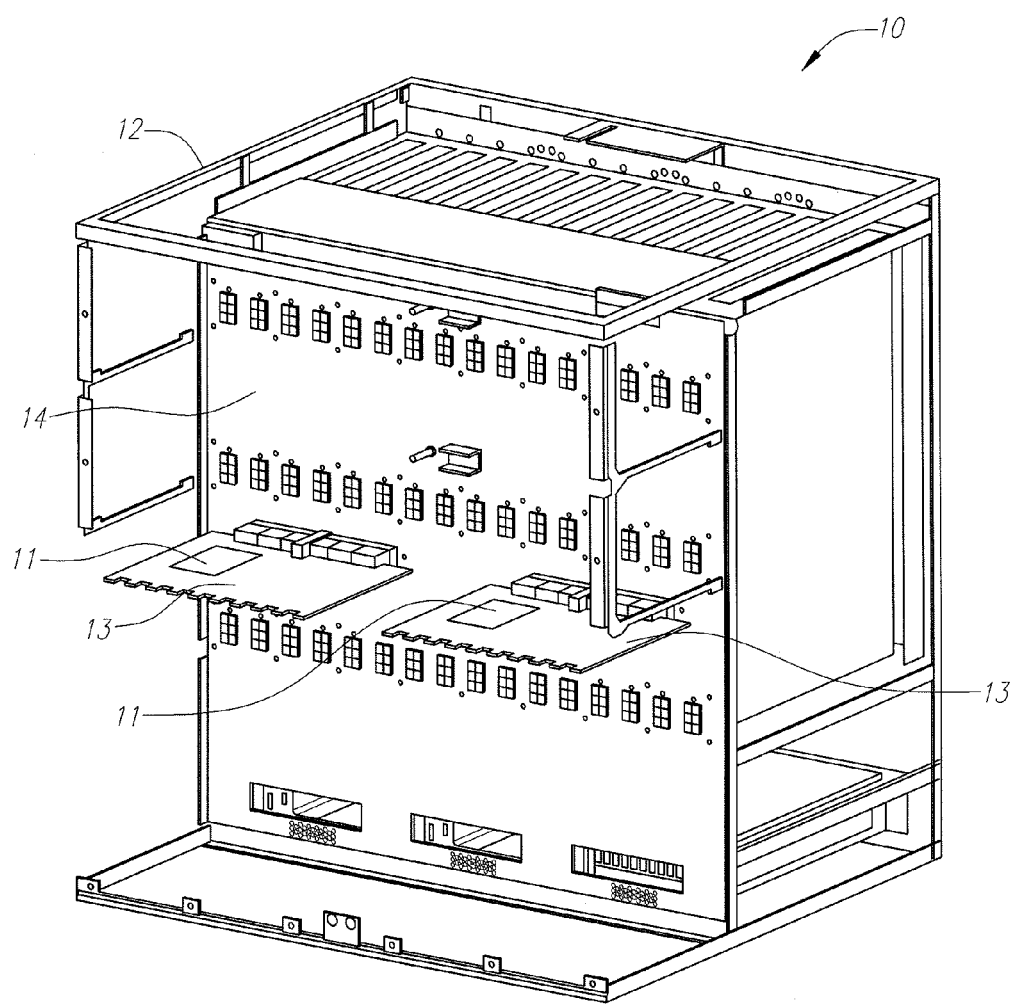
FIG. 2A illustrates a back perspective view of an embodiment of a device for data transfer with configurable slot sizes.

FIG. 2A illustrates a back perspective view of an embodiment of a device for data transfer with configurable slot sizes. As may be seen in FIG. 2A, the backplane 14 may incorporate or be in communication with a processor 11 or a plurality of processors 11 to control the chassis 12 and its corresponding functions. The processor 11 may be an Application Specific Integrated Circuit (ASIC), Field Programmable Gate Array (FPGA), PowerPC, Intel Processor, Digital Signal Processor (DSP) or any other type of processor 11. In a preferred embodiment, the system includes more than one processor 11 for redundancy. In an even more preferred embodiment, each of the plurality of processors 11 are located on a hot-swappable card 13 so that they can be removed and replaced without disturbing the function of the system. The processor 11 may be responsible for a number of tasks including selection and control of the cards, providing monitoring services, controlling the chassis 12 and its components such as fans and power supplies, and other general functions of the chassis 12 and overall system.

Figure 3:
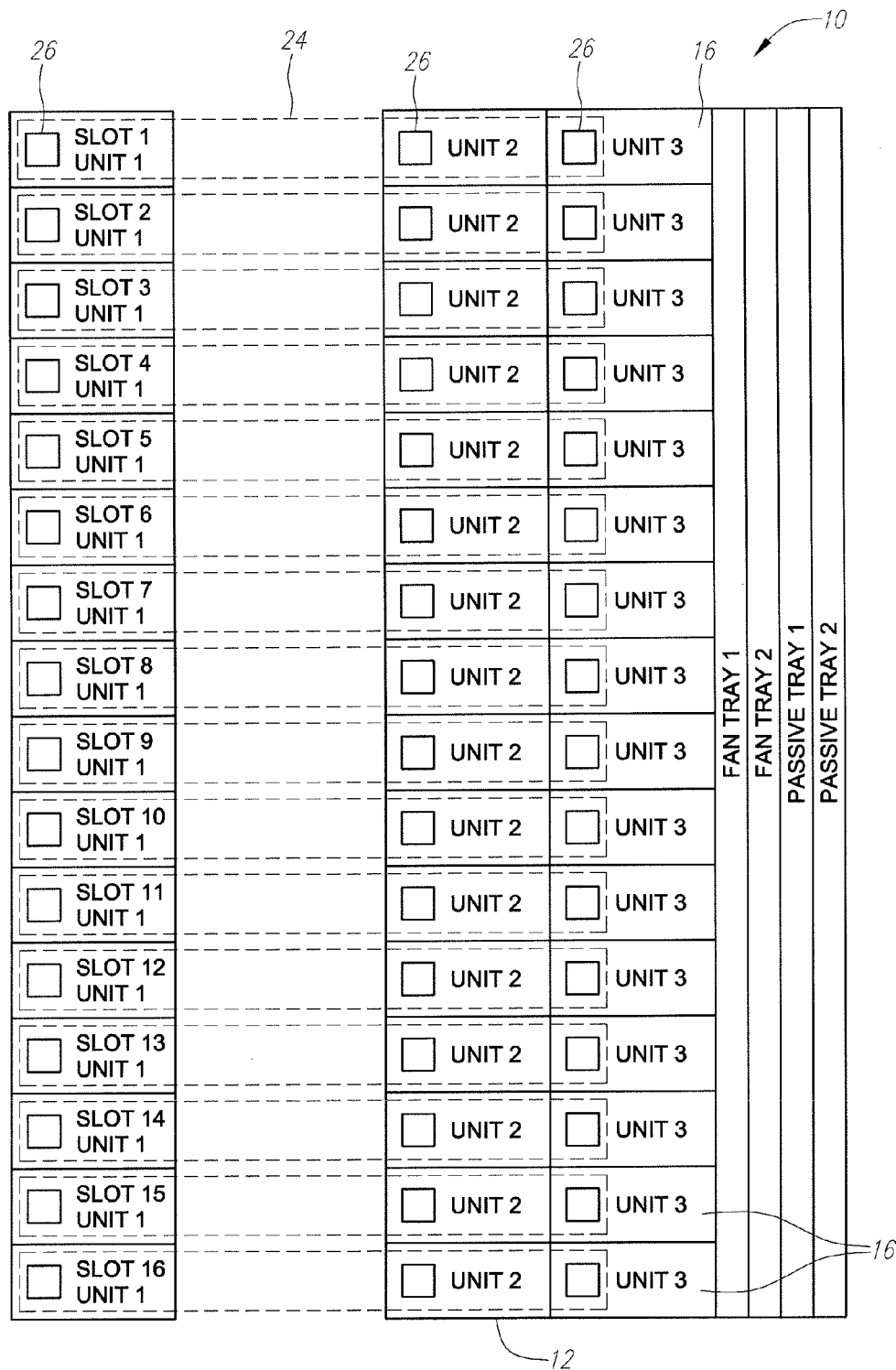
FIG. 3 illustrates a schematic view of an embodiment of a device for data transfer with configurable slot sizes.

FIG. 3 illustrates a schematic view of an embodiment of a device for data transfer with configurable slot sizes. As may be seen in the embodiment shown in FIG. 3, each slot 16 has a connector 26 allocated to one of three unit locations. As mentioned above, other embodiments may have more connectors/units allocated to each slot 16.

In some embodiments, not every single slot 16 will have all the same number of connectors 26. For example, in the embodiment shown in FIG. 3, the slots 16 in the 15th and 16th positions have different connectors 26 associated with the unit 1 location than the other 14 slots 16 of the chassis 12. In particular, in the embodiment shown in FIG. 3, the slots 16 in the 15th and 16th positions include two 55-pin connectors associated with the unit 1 location. By using an additional connector in the unit 1 location, the slots 16 in the 15th and 16th positions can support a standard card designed for use in any slot 16 or a unique card that incorporates the use of the additional connector 26.

In a preferred embodiment, at least one slot 16 has an additional connector that is in electrical communication with the processor 11 on the backplane 14 and is designed to support a network management (NM) card. In the embodiment shown in FIG. 3, the additional connector 26 associated with the unit 1 position of the slots 16 in the 15th and 16th positions in the chassis 12 provides additional electrical communication with the processor boards 13 of the backplane 14 for supporting network management NM cards. In other embodiments, other slot positions may include additional connectors 26 and may be adapted for supporting cards with other unique applications. In a preferred embodiment, the slot positions adapted to support unique card applications are designed so that they are still compatible with standard cards.

Although some of the slots 16 in the chassis 12 may have an additional connectors 26, or a pattern of connectors 26 within the group of connectors 24 that does not match the other groups of connectors 24, in a preferred embodiment, a majority of the slots 16 have the identical group of connectors 24 arranged along the length of each slot 16. In a more preferred embodiment, less than 20% of the slots 16 have a group of connectors 24 that differs from the other slots 16. In an even more preferred embodiment, less than 10% of the slots 16 have a group of connectors 24 that differs from the other slots 16. In some embodiments, the group of connectors 24 may be identical in every slot 16. In some embodiments, a single slot 16 may have a group of connectors 24 that differs from the other slots 16.

Figure 4:
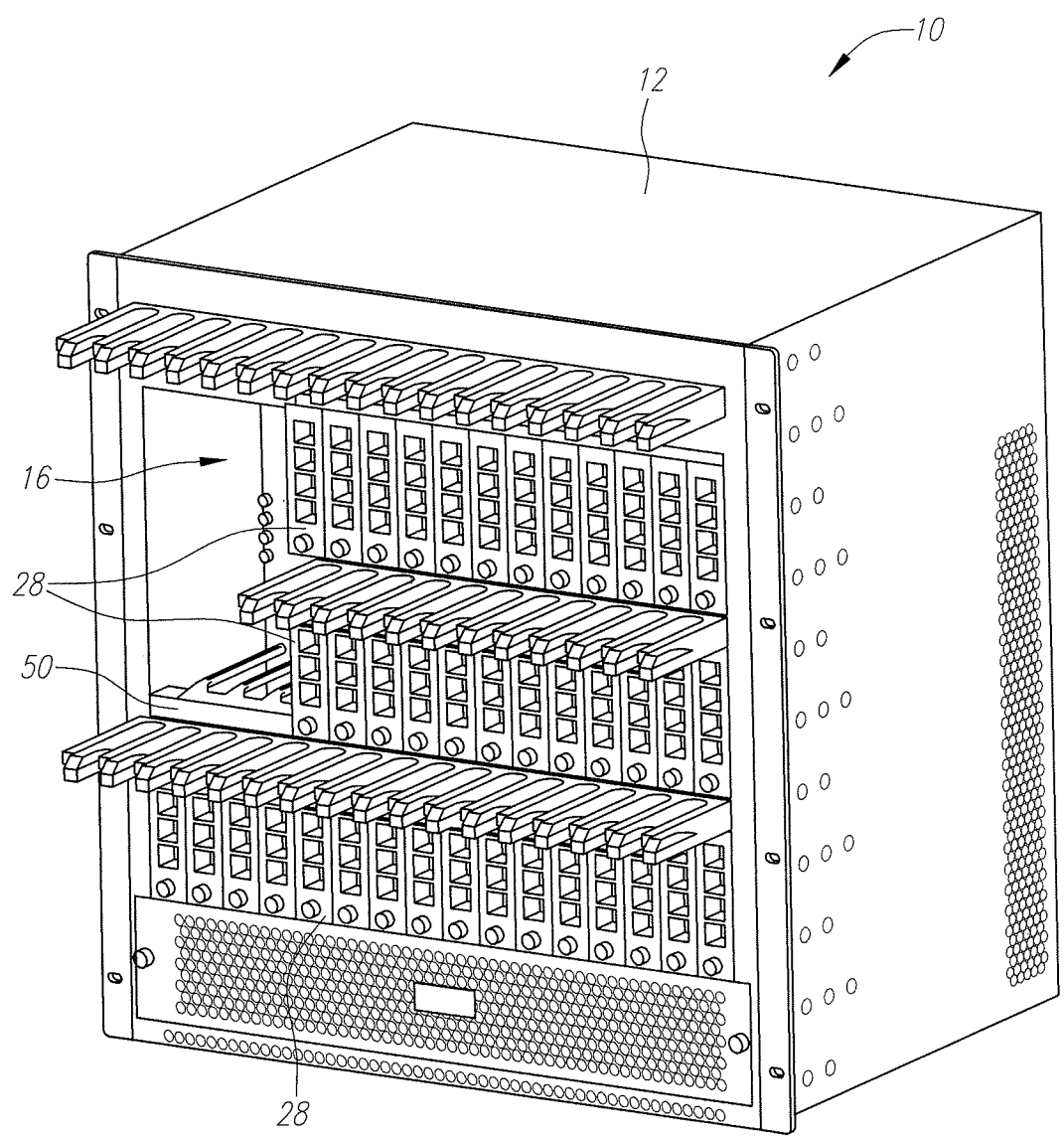
FIG. 4 illustrates a perspective view of an embodiment of a device for data transfer with configurable slot sizes.

FIG. 4 illustrates a perspective view of an embodiment of a device for data transfer with configurable slot sizes. In the embodiment illustrated in FIG. 4, the slots 16 are populated with a plurality of cards 1 unit in height. The slots 16 in positions 1 through 4 have a single 1 unit card in the unit 1 location. The slots 16 in positions 5-16 each have three 1 unit cards located in the unit 1, unit 2, and unit 3 locations.

As may be seen in FIG. 4, when more than one card is inserted into a single slot 16, a divider 50 may be inserted between the cards to help secure the cards in the chassis 12. The divider 50 may also be referred to as a spacer, adapter, or bridge. One purpose of the divider 50 is to divide the slot 16, or a portion of the slot 16, such that it may hold more than one card. Accordingly, the divider 50 is arranged in the slot 16 between two connectors 26. The divider 50 is designed to assist in holding a card with a card length less than the length of the slot 16.

In some embodiments, a divider 50 may divide a single slot 16. In other embodiments, the divider 50 may span one or more slots 16 such that it divides a plurality of slots 16. For example, in a 16 slot chassis, a divider that divides four (4) slots may be used. Accordingly, 4 dividers 50 would span completely across a vertical slot chassis. In another embodiment, a single divider 50 may span across all the slots 16 in the chassis 12.

In various different embodiments, the dividers 50 may attach to the backplane 14, the chassis 12, another divider 50, an already installed card, or any combination of those attachment points. At each attachment point there is an attachment interface. For example, in a preferred embodiment, the backplane 14 has an interface between the connectors 26 in a group of connectors 24 designed to allow a divider 50 to be removeably coupled to the backplane 14. The interface is designed to allow the divider 50 to be removable. In a preferred embodiment, a press fit post located on the back of the divider 50 may press fit into a hole in the backplane 14, chassis 12 or both to secure the back of the divider. In some embodiments, the interface may be a threaded insert designed to accept a threaded fastener. In other embodiments, other types of interfaces and corresponding fasteners maybe used including, bolts, nuts, interference fit or press fit, slides, snaps, or dove tails to name a few. The dividers 50 are designed to be removeably attached so that the size of the slots 16 may be reconfigured at any time.

Figure 5:
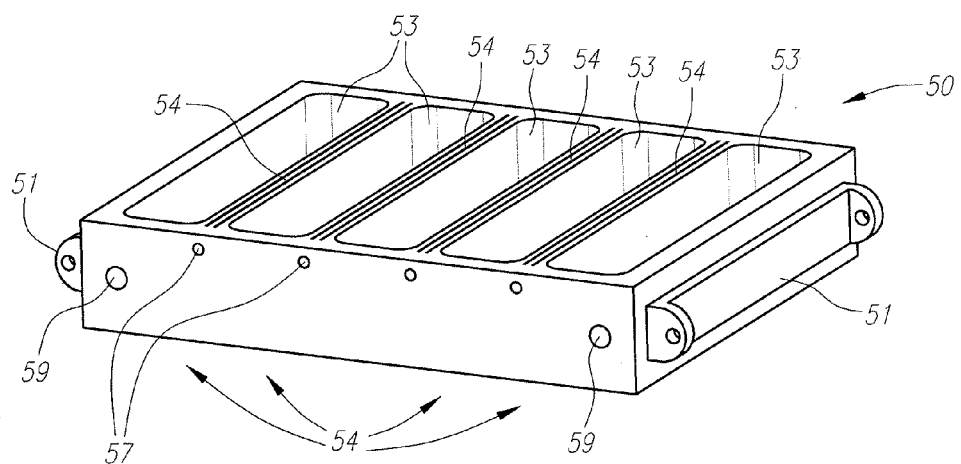
FIG. 5 illustrates a perspective view of one embodiment of a removable divider designed to partition a slot into multiple units.

FIG. 5 illustrates a removable divider 50 designed to partition a single slot 16 into multiple units. The divider 50 includes a plurality of guides 54 on the top surface and a plurality of guides 54 on the bottom surface. This allows the divider 50 to guide cards above and below the divider 50. In a preferred embodiment, the divider may have a number of open spaces 53 that allow airflow to pass through the divider. The open spaces 53 allow vertical airflow within the chassis so that circulation is maintained and the cards can continually be cooled. In a preferred embodiment, these open spaces may be purposely made small via flanges on either side of the guide 54. Restricting the size of the open spaces maintains a positive vertical pressure within the chassis and maintains a forced vertical air flow.

In a preferred embodiment, a divider 50 may have a side bracket 51. In some embodiments side bracket is removeable. Side bracket 51 allows the divider 50 to mate with another divider 50. If a divider 50 does not have an additional divider 50 to mate with, the side bracket may be removed to prevent it from interfering with the insertion of a card.

In a preferred embodiment, a divider 50 may have mating holes 59. Mating hole 59 allows divider 50 to mate with another divider. A fastener may be placed through hole 59 and into bracket 51 or a portion of the chassis such as a side post.

In a preferred embodiment, divider 50 may also provide a number of threaded holes 57 to allow cards to screw into. Typically, the thumb screws of a card would thread into these holes once the divider 50 and the cards were inserted in a chassis.

Figure 5A:
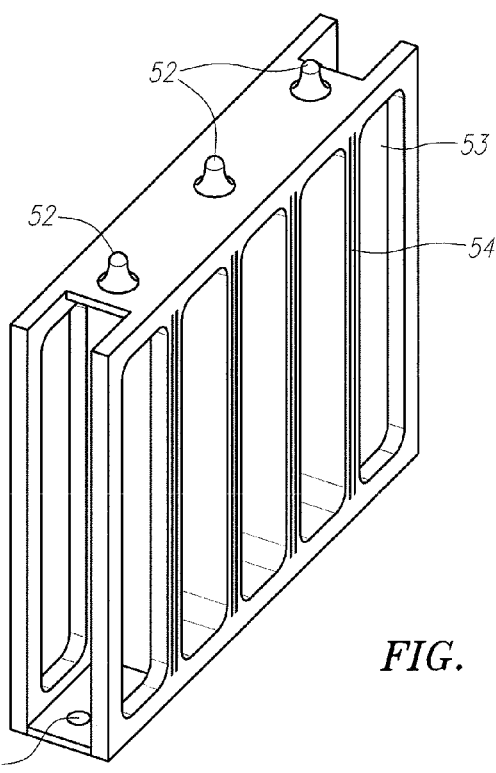
FIG. 5A illustrates a side perspective view of the divider of FIG. 5.

FIG. 5 illustrates a side perspective view of the removable divider 50 of FIG. 5. In a preferred embodiment, like the one shown in FIG. 5A, the back of the divider 50 includes a number of mating interfaces 52. In the preferred embodiment, the divider includes a number of press fit posts that may be pressed into the backplane and/or chassis to support the divider. Once the divider is "snapped" in, a fastener such as a screw may be used to secure the front of the divider 50 to either the chassis or another divider 50.

Figure 6:
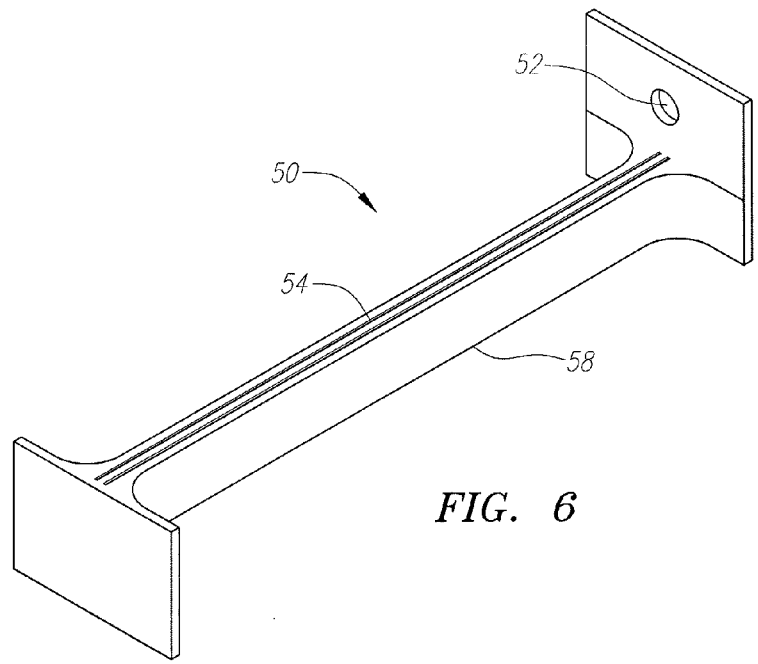
FIG. 6 illustrates one embodiment of a removable divider designed to partition a single slot into multiple units.

FIG. 6 illustrates a removable divider 50 designed to partition a single slot 16 into multiple units. The divider 50 includes a mating interface 52. In the embodiment shown in FIG. 6, the mating interface is designed to mate with an interface on the backplane. For example, the mating interface 52 shown in FIG. 6 is a hole designed to allow a screw to pass through.

In a preferred embodiment, the divider 50 includes a guide 54. The guide 54 is designed to help secure the card in place in the slot 16 and align a connector on the card with a connector on the backplane 14. In the preferred embodiment, the guide interfaces with the edge of a card. In the embodiment shown, the guide is on top of the divider 50. However, the guide may be on bottom of the divider 50 or on the side of the divider 50—in the case of a horizontal slot. In preferred embodiments, the divider 50 may also include a second guide 58. In the embodiment shown in FIG. 6, the second guide 50 is on the bottom of the guide. Having a guide on the top and the bottom of the divider 50 allows the divider 50 to secure a card both above the divider 50 and below the divider 50.

Figure 6A:
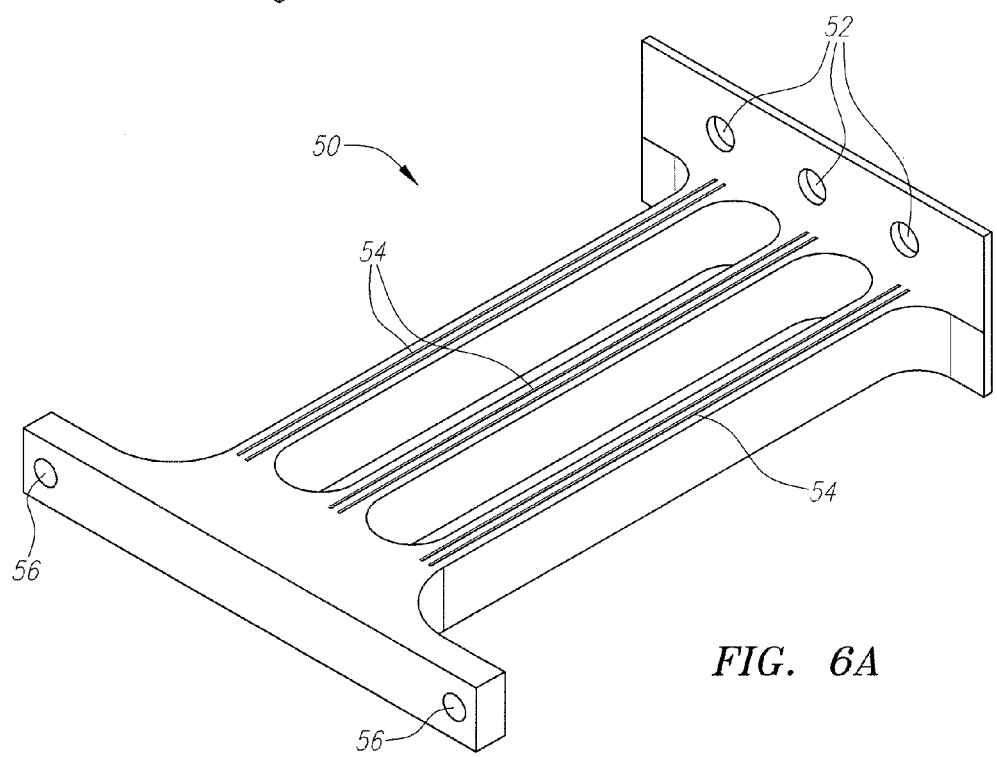
FIG. 6A illustrates one embodiment of a removable divider designed to partition a plurality of slots into multiple units.

FIG. 6A illustrates a removable divider 50 designed to partition a plurality of slots 16 into multiple units. The embodiment shown in FIG. 6A is designed to bifurcate 3 slots 16. However, in other embodiments, a divider 50 may be designed to bifurcate any number of slots 16. In some embodiments, the divider 50 may be designed to bifurcate all the slots 16 in a particular chassis 12. As may be seen in FIG. 6A, the divider 50 may have a number of interfaces 52, designed to interface and couple the divider 50 to the backplane 14.

In a preferred embodiment a divider 50 is made from metal. However, in other embodiments, a divider 50 may be made from other materials such as rubber, plastic or any other material that provides an appropriate rigidity to the divider 50. If the divider 50 is manufactured from metal, aluminum or stainless steel are two of many suitable choices. In a preferred embodiment, the divider 50 is made from the same material as the chassis 12. In some embodiments, the guide 54 may be made from a separate material designed to better secure a card. For example, the guide 54 may be made from a smooth plastic or other material designed to allow a card to slide in and out more easily. Using non-conductive materials for the construction of a divider 50 is advantageous to help eliminate the potential of a short circuit occurring between a card and the divider 50.

In some embodiments, the divider 50 may also include additional interfaces 56 designed to secure the divider to the chassis 12, brackets, or other already installed cards.

In some embodiments, the individual dividers 50, like the embodiment shown in FIG. 5, may be assembled together to form a larger divider 50 designed to bifurcate a plurality of slots 16 like the one shown in FIG. 6A. Preferably, the dividers 50 are designed such that they may be linked or coupled together to form a divider 50 that spans any number of slots.

Figure 7:
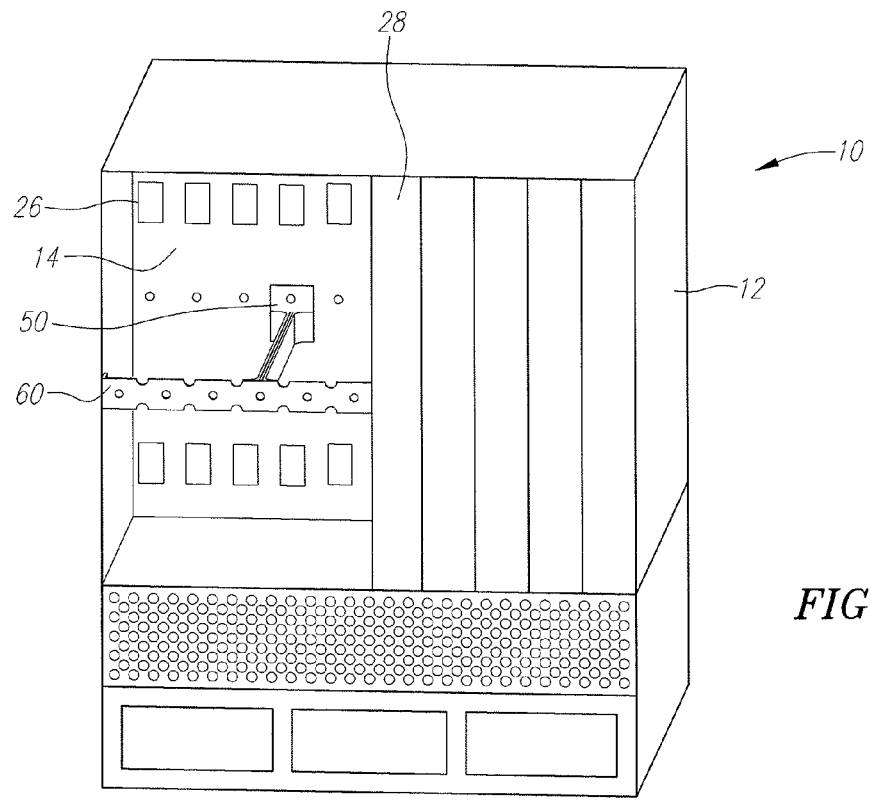
FIG. 7 illustrates a view of an embodiment of a device for data transfer with configurable slot sizes.

In some embodiments, the dividers 50 may mate with additional brackets designed to provide support for the dividers 50. FIG. 7 illustrates a view of an embodiment of a device for data transfer 10 with configurable slot sizes. The embodiment shown in FIG. 7 includes a bracket 60 and a divider 50. In the embodiment shown, the bracket 60 spans horizontally across the front of the chassis 12 from a side of the chassis to the front of an already installed card 62. In embodiments that use a horizontal bracket 60, the dividers 50 may span from the backplane 14 to the bracket 60.

Figure 8:
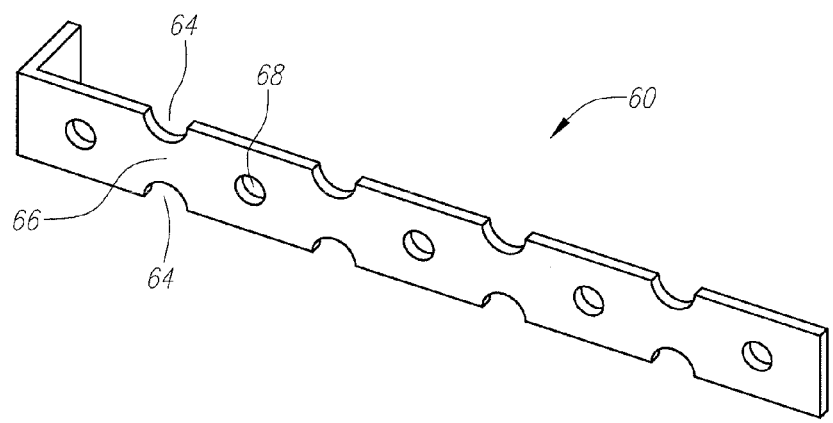
FIG. 8 illustrates one example of a bracket that may be used in conjunction with a divider to partition a slot into multiple units.

FIG. 8 illustrates one example of a bracket 60 that may be used in conjunction with a divider 50 to bifurcate a slot 16. The bracket 60 may include a number of interfaces 68 for securing the bracket 60 to the chassis 12, another bracket, another card, or any other portion of the system that may supply structural support for the bracket 60.

In some embodiments, the bracket 60 may contain a number of indentations 64 on the top and bottom of the bracket 60 such that a tab 66 is formed between the indentations 64. The indentations 64 may be spaced apart along the length of the bracket 60 a distance equal to a slot width such that a tab 66 is formed between each set of indentations with a spacing approximately equal to the slot spacing. The tabs 66 may be designed to allow the bracket 60 to be easily broken at the tab locations such that the length of the bracket 60 may be easily configurable. In practice, a user may cause the bracket 60 to be broken through the fatigue of repetitive bending at the location of a particular tab and thus, shorten the bracket to the correct length to be installed in the chassis 12. In other embodiments, rather than tabs 66, the brackets 60 may simply have locations of weakened metal spaced appropriately. One embodiment may have small grooves cut to an appropriate depth to allow the bracket 60 to retain sufficient rigidity but yet still be easily broken by fatiguing the metal through repetitive bending along the groove. In yet other embodiments, the brackets 60 may come in a fixed length or a plurality of fixed lengths.

Figure 9:
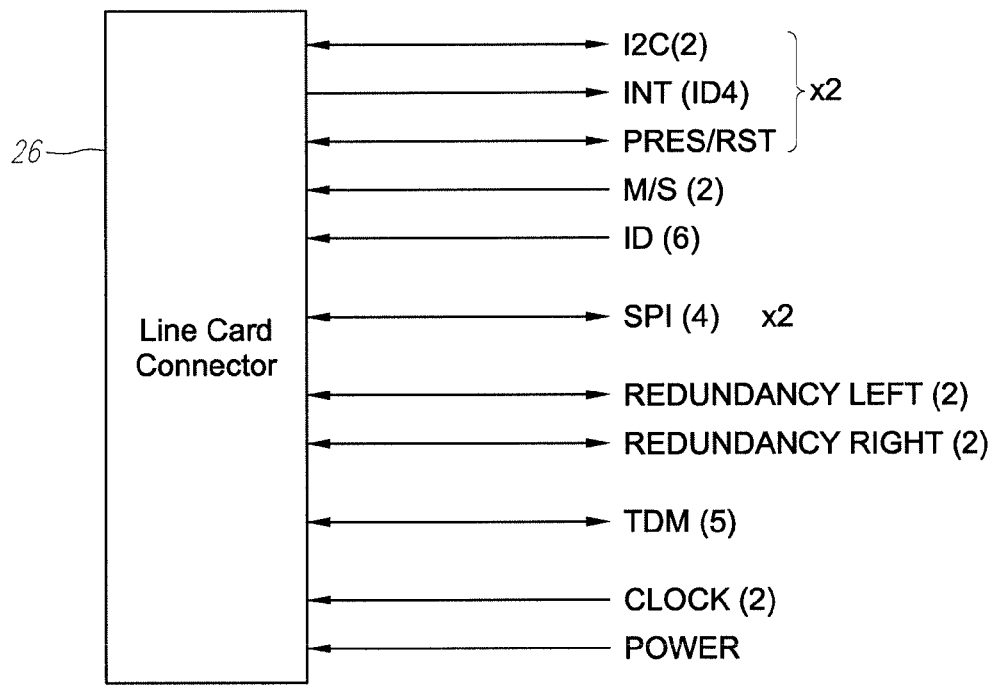
FIG. 9 illustrates a schematic diagram of a pin-out for one embodiment of a connector that may be used in a device for data transfer with configurable slot sizes.

FIG. 9 illustrates a schematic diagram of a pin-out for one embodiment of a connector 26 that may be used in a device for data transfer with configurable slot sizes. In a preferred embodiment, each connector 26 within a group of connectors 24 has an identical pin-out. This allows a card to use the same interfacing connector design and still be electrically connected to any connector 26 within the group of connectors 24. Moreover, in a preferred embodiment, each connector 26 in a group of connectors 24 provides the same services to a card through the corresponding identical pin regardless of which connector within the group of connectors the card is electrically connected to. Accordingly, in a preferred embodiment, a single slot 16 may support a single card by plugging the single card into a single connector 26, or a single slot 16 may support multiple cards by plugging the cards into each of the electrical connectors 26 within the group of connectors 24 associated with the slot 16.

Figure 9A:
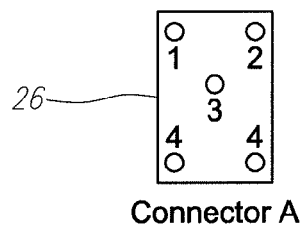
FIG. 9a illustrates a pair of connectors A and B with their corresponding pins in the same relative positions labeled 1-5.
Figure 9A:
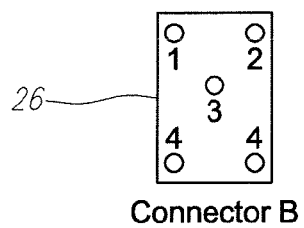

FIG. 9a illustrates a pair of connectors with their corresponding pins in the same relative positions labeled 1-5. As may be seen in FIG. 9a, the two connectors A and B have the same pin-out configuration. Pins 1-5 of Connector A correspond to pins 1-5 in the same relative position in Connector B.

In a preferred embodiment, pins in the same relative position in each connector 26 may be connected to the same bus on the backplane 14 not only from slot-to-slot, but also within the same group of connectors 24 in the same slot. Accordingly, in a preferred embodiment, pins in the same relative positions on connectors 26 within a group of connectors 24 are all attached to the same corresponding buses. This allows the backplane 14 to provide the same services to each connector 26 within a group of connectors 24 within the same slot 16. In certain embodiments, pins in the same relative position on connectors 26 that are in different slots 16 may also be connected to the same bus on backplane 14.

Figure 10:
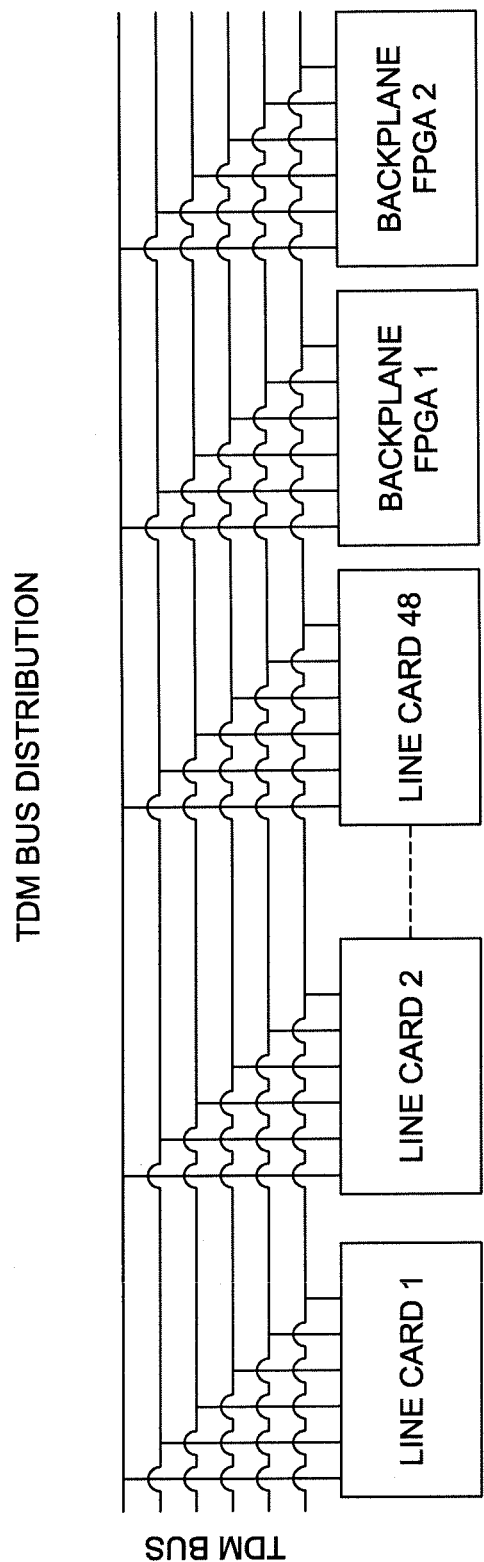
FIG. 10 illustrates one example of how identical pins in connectors in the same group of connectors may be connected to the same bus.

FIG. 10 illustrates one example of how identical pins in connectors 26 in the same group of connectors 24 may be connected to the same bus. FIG. 10 illustrates the five (5) pins that correspond to the time division multiplexing (TDM) bus. FIG. 5 is illustrating the TDM bus connections for a sixteen (16) slot 16 chassis 12. In the embodiments used herein, the sixteen slot chassis includes sixteen 16 groups of connectors 24 with 3 connectors 26 in each group. A chassis 12 with this configuration could hold up to 48 cards with 1 unit height—minus any spaces needed for NM cards. As may be seen by the schematic in FIG. 10, each pin of the five TDM bus pins is connected to a separate bus. However, the corresponding identical pin on each of the 48 connectors 26 is connected to the same corresponding bus. This allows the processors to communicate with each connector 26 in a group of connectors 24 in the same way as the processors communicate with connectors 26 in different slots 16. Accordingly, the processors can communicate with multiple cards in the same slot 16 in the same way the processors communicate with multiple cards in different slots 16.

In a preferred embodiment, other services may be allocated not only from slot-to-slot but to multiple cards within the same slot 16 by electrically coupling corresponding pins from different connectors 26 within a group of connectors 24 to the same bus. For example, connectors within the same group of connectors 24—or connectors in the same slot 16—may have corresponding pins for power, communication buses, clocks, control or any other functions that may need to be shared.

One advantage of having multiple connectors in the same slot 16, is that cards that span multiple connectors may use more than one connector to increase services to the card. For example, a card may plug into two connectors instead of one and have access to double the power or double the communication bandwidth.

While, preferably, many of the pins in each connector within the same group of connectors are electrically coupled to the same services, in some embodiments, not all the corresponding pins in connectors 26 within the same group of connectors 24 may be connected to the same services. As just one example, in embodiments that provide card-to-card redundancy, the corresponding pins associated with card-to-card redundancy may only be shared in corresponding connectors from slot-to-slot and not between connectors in the same slot 16. However, in embodiments where redundancy may be provided between cards in the same slot 16, corresponding pins on connectors 26 in the same slot 16 may share a common bus.

Figure 11:
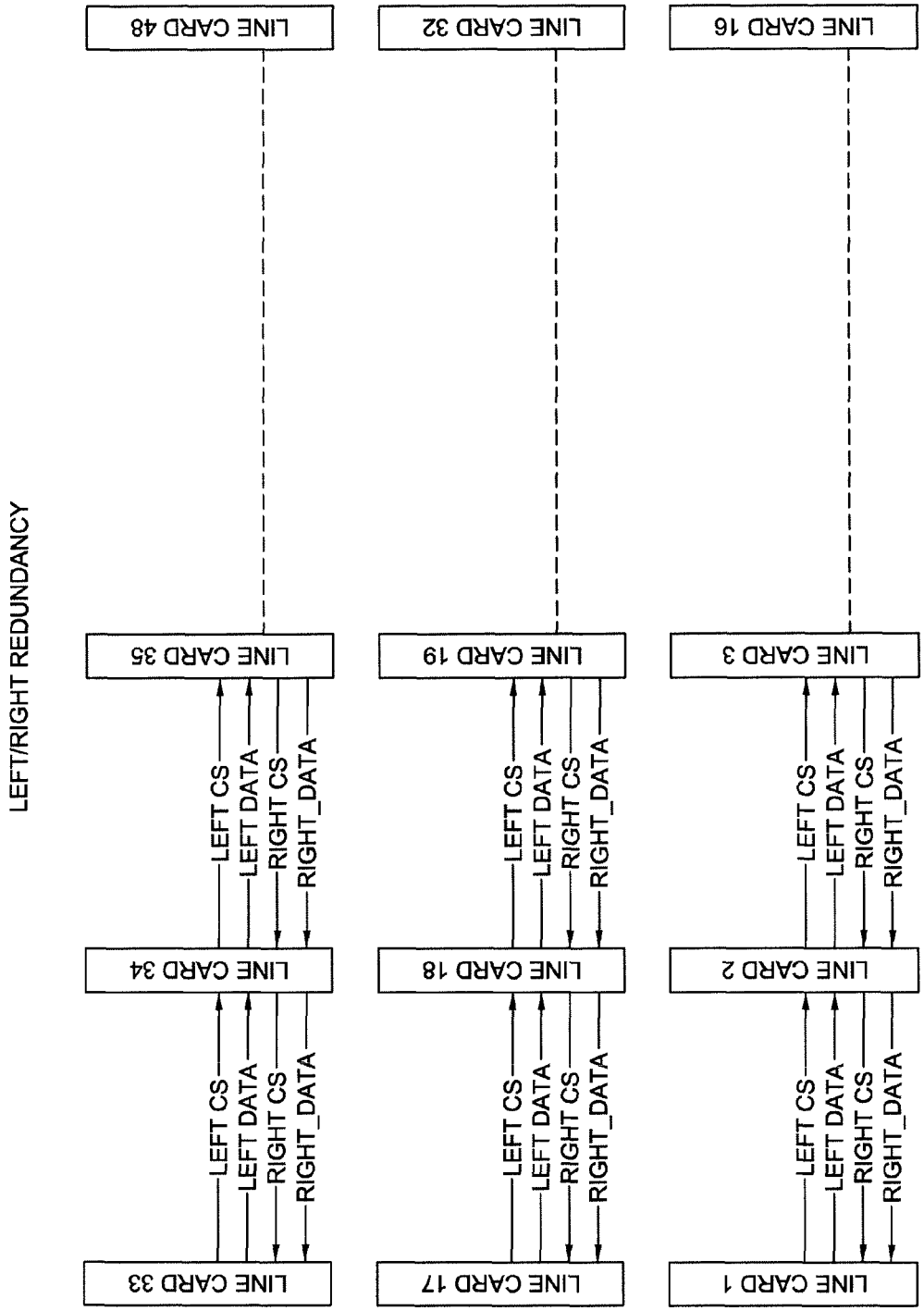
FIG. 11 illustrates an embodiment of how the corresponding connectors in each of the slots may have their pins corresponding to redundancy left and redundancy right connected to provide redundancy between cards in different slots.

FIG. 11 illustrates an embodiment of how the corresponding connectors 26 in each of the slots 16 may have their pins corresponding to redundancy left and redundancy right connected to provide redundancy between cards across slots 16. In order to facilitate redundancy, a "Y" connector is used to duplicate the incoming signal to each card. Redundancy may be configured in numerous other ways as known by those skilled in the art.

When using a data transfer device with configurable size slots, a user may easily adapt the slots 16 to receive a plurality of cards of different form factors. A user may install a first card of a first length into a first slot 16. Next the user may install a removeable divider 50 along a length of a second slot 16 by screwing the divider 50 into the backplane 14. Once the divider is installed, the user may install a second card of a second length, substantially different from the first length of the first card, in the second slot. In a preferred embodiment, a card with a substantially different length is 20% longer or shorter than the other card. In a more preferred embodiment, a card with a substantially different length is 50% larger or shorter than the other card. In an even more preferred embodiment, a card with a substantially different length is 100% larger or shorter than the other card.

In various different embodiments, the user may couple the second card to the divider 50 with any number of fasteners. In a preferred embodiment, the user couples the second card to the divider 50 with a thumb screw. Once the second card is installed the user may install a third card of a third length, substantially different from the first length of the first card, in the second slot 16. In some embodiments, the second card and the third card are the same length.

After installing the third card, the user may install a fourth card of a fourth length, substantially different from the first length of the first card, in the second slot 16. Accordingly, the user can continue to install dividers 50 and cards in additional slots using the methods above until the desired configuration is achieved.

In one embodiment of an installation, the first card is electrically coupled to a backplane 14 by a first connector 26 in a first group of connectors 24 arranged along a length of the first slot 16 and the second card is electrically coupled to the backplane 14 by a second connector 26 in a second group of connectors 24 arranged along a length of the second slot 16 such that the first connector and the second connector are located in different locations along the length of their respective slots 16.

As one skilled in the art will recognize, although the embodiments used herein demonstrate slots 16 that may be configured in different combinations of 3 unit, 2 unit and 1 unit cards, in other embodiments slots 16 may be divided into other fractional units without departing from the scope of the present patent document. As just one example, in another embodiment, a single slot 16 may be configurable to support up to four 1 unit cards. In such an embodiment, combinations of 4 unit, 3 unit, 2 unit, and 1 unit cards are possible. In other similar embodiments, slots may be broken into greater or fewer fractional portions.

Figures 12, 13:
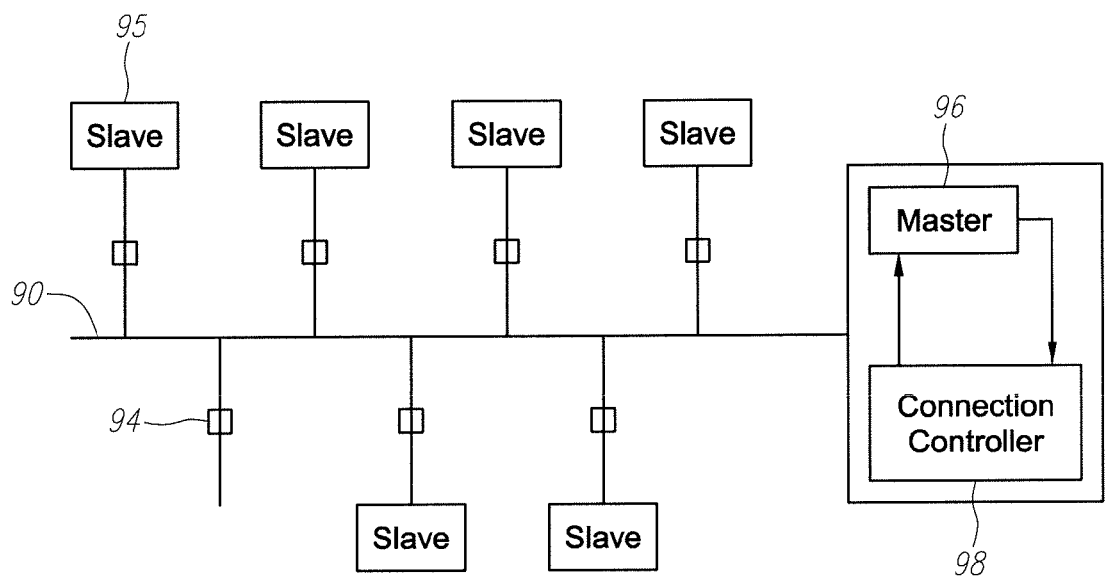
FIG. 12 illustrates an embodiment of a chassis that allows cards span slots and units in two directions.
FIG. 13 illustrates an embodiment of a shared bus designed to support point-to-point communication.

Embodiments described herein are not limited to just spanning vertical slots, and within the same chassis, cards can span horizontal slots as well as horizontal and vertical slots at the same time. FIG. 12 illustrates a chassis 12 with 10 slots that may be divided into 30 units 1-30. A single card could span units 1, 2, 4 and 5 taking up the top two thirds of slots 1 and 2. A single card could span units 10 and 11 of slot 4, or units 17, 20, and 23 of slots 6, 7 and 8, or units 28-30 of slot 10 all in the same chassis. Accordingly, in the preferred embodiments disclosed herein, the size of the card may be totally flexible in both directions.

In embodiments, where a card can take on any shape and span any number of units or slots, the chassis must have some means for determining the location and size of the cards installed. In a preferred embodiment, each unit of the chassis has a connector in communication with the TDM bus. Accordingly, for the example shown in FIG. 12, there would be 30 time slots on the TDM bus. Every card broadcasts to the controller on the TDM its configuration. If a card spans more than one unit, the card may broadcast in a time slot in accordance with a scheme. For example, in a preferred embodiment, each card may broadcast on the timeslot associated with the lowest unit number for which the card belongs. Once the controller figures out where are all the cards are, it may inform the other cards of their neighbors in the chassis.

Many embodiments of chassis with multiple slots use an I²C bus. The normal I²C bus is a shared line. The master can read and write to all devices on the bus. The cards of the chassis are connected directly to the I²C bus through the mating of the connector on the card with a connector on the backplane. A problem exists if the master 96 is currently writing or reading from a slave 95 when a card is inserted into the chassis. The insertion of the card and the physical connection to the I²C bus may interfere with the currently occurring communication and corrupt it. If a standard I2C bus is used, this problem may be exaggerated in the embodiments of the present patent document. Accordingly, a shared bus, which in some embodiments may be I²C, with dedicated point to point communication lines may be used to ameliorate this problem.

FIG. 12 illustrates one embodiment of a shared bus with dedicated point to point communication lines. The shared bus 90 is connected to the master 90 but also to a connection controller 98. Each slave 95, which may be a card, is isolated from the shared bus 90 by a switch 94. All the switches 94 on the shared bus 90 remain closed unless the master 96 is actively communicating with the slave 95. When the master 96 wants to communicate with the slave 95, it requests the connection controller 98 to close the switch 94. The switch 94 to a particular slave 95 or group of slaves is/are closed and the communication occurs. When the master 96 is done communicating, it notifies the connection controller 98 and the switch or switches are closed. To this end, a card being inserted into a slot cannot cause a spike on the shard bus and interrupt a currently ongoing communication between the master and another card/slave. To this end, a shared bus like an I²C bus, may be in a sense performing point-to-point communication.

Although the embodiments have been described with reference to preferred configurations and specific examples, it will readily be appreciated by those skilled in the art that many modifications and adaptations of the electronic device with a customizable image and methods therefore described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A data transfer device comprising:
   a chassis;
   a backplane;
   a slot arranged within the chassis and configured to hold a card;
   a connector system integrated on the backplane and configured to electrically couple the card with the backplane;
   wherein the connector system includes a group of connectors arranged along a length of the slot such that a plurality of cards with card lengths less than the length of the slot may be electrically coupled to the backplane within a single slot;
   a plurality of holes located along the backplane, the plurality of holes including individual holes located between connectors in a group of connectors; and
   a divider configured to removeably attach to the backplane along the length of the slot and assist in holding a plurality of cards with card lengths less than the length of the slot the divider comprising:
      a guide on a top surface and a guide on a bottom surface wherein each guide is designed to receive a card edge;
      a press fit post extending outward from a back of the divider, the press fit post designed to press into one of the holes in the plurality of holes;
      a removeable side bracket, the removeable side bracket including an interface designed to receive a fastener;
      mating holes on each end of a front surface of the divider, the mating holes spaced from an edge of the divider appropriately to allow mating with a side bracket of another divider and,
      a number of threaded holes on the front surface designed to receive the thumb screws of a card.

2. The data transfer device of claim 1, wherein a pin configuration of each connector in the group of connectors includes both power pins and data pins.

3. The data transfer device of claim 2, wherein the pin configuration of each connector in the group of connectors is identical.

4. The data transfer device of claim 1, wherein the chassis includes a plurality of slots and a majority of the slots have the identical group of connectors arranged along a length of each slot.

5. The data transfer device of claim 1, wherein the divider is configured to removeably attach to the chassis or another divider in an adjacent slot via the interface on the removeable side bracket.

6. The data transfer device of claim 3, wherein connectors within a group have pins in the same relative position connected to the same buses.

7. The data transfer device of claim 1, wherein the data transfer device is designed to hold optical networking cards.

8. The data transfer device of claim 1, wherein the group of connectors comprises three connectors spaced approximately equally along the length of the slot.

9. The data transfer device of claim 1, wherein all the connectors within the group of connectors are CompactPCI connectors.

10. The data transfer device of claim 1 further comprising:
a first card of a first length in the slot; and
a second card of a second length, substantially different from the first length of the first card, in a second slot.

11. The data transfer device claim 10, further comprising a third card of a third length, substantially different from the first length of the first card, in the second slot.

12. The data transfer device of claim 11, wherein the second card and the third card are the same length.

13. The data transfer device of claim 11, further comprising a fourth card of a fourth length, substantially different from the first length of the first card, in the second slot.

14. The data transfer device of claim 10, wherein the first card is electrically coupled to the backplane by a first connector in a first group of connectors arranged along the length of the slot and the second card is electrically coupled to the backplane by a second connector in a second group of connectors arranged along a length of the second slot and wherein the first connector and the second connector are located in different locations along the length of their respective slots.

* * * * *